US008139786B2

(12) United States Patent
Berkhout

(10) Patent No.: US 8,139,786 B2

(45) Date of Patent: Mar. 20, 2012

(54) PLOP NOISE AVOIDANCE FOR AN AMPLIFIER

(75) Inventor: Marco Berkhout, Nijmegen (NL)

(73) Assignee: NXP B.V., Eindhoven (NL)

(*) Notice: Subject to any disclaimer, the term of this patent is extended or adjusted under 35 U.S.C. 154(b) by 1349 days.

(21) Appl. No.: 11/596,790

(22) PCT Filed: May 9, 2005

(86) PCT No.: PCT/IB2005/051510

§ 371 (c)(1), (2), (4) Date: Nov. 16, 2006

(87) PCT Pub. No.: WO2005/112252

PCT Pub. Date: Nov. 24, 2005

(65) Prior Publication Data

US 2007/0229163 A1 Oct. 4, 2007

(30) Foreign Application Priority Data

May 17, 2004 (EP) .................................... 04102156

(51) Int. Cl.
*H04B 15/00* (2006.01)

(52) U.S. Cl. ..................................... 381/94.1; 381/94.5

(58) Field of Classification Search ................. 381/94.1, 381/94.5, 121, 120; 330/51, 285, 257, 288, 330/10, 149, 207 A; 323/315

See application file for complete search history.

(56) References Cited

U.S. PATENT DOCUMENTS

| | | | |
|---|---|---|---|
| 3,976,955 A | 8/1976 | Hamada | |
| 4,638,507 A | 1/1987 | Palara et al. | |
| 4,667,065 A * | 5/1987 | Bangerter | 379/351 |
| 4,929,908 A | 5/1990 | Imanishi | |
| 5,805,020 A * | 9/1998 | Danz et al. | 330/10 |
| 5,917,380 A | 6/1999 | Darthenay et al. | |
| 6,118,336 A | 9/2000 | Pullen et al. | |
| 6,259,321 B1 * | 7/2001 | Song et al. | 330/254 |
| 6,879,210 B2 * | 4/2005 | Takemura | 330/254 |
| 6,922,474 B2 * | 7/2005 | Hayama | 381/94.5 |
| 7,035,417 B1 * | 4/2006 | Packard | 381/94.1 |
| 2001/0020871 A1 * | 9/2001 | Titus | 330/278 |
| 2002/0093380 A1 | 7/2002 | Cali | |
| 2003/0076170 A1 | 9/2003 | Nagode et al. | |
| 2003/0231059 A1 | 12/2003 | Takemura | |

FOREIGN PATENT DOCUMENTS

| | | |
|---|---|---|
| CN | 1179033 A | 4/1998 |
| CN | 1312612 A | 9/2001 |
| CN | 1489826 A | 4/2004 |
| EP | 0 813 295 A1 | 12/1997 |
| EP | 1 357 664 | 10/2003 |
| JP | 56-96546 A | 8/1981 |
| JP | 04331511 A * | 11/1992 |

* cited by examiner

*Primary Examiner* — Vivian Chin

*Assistant Examiner* — Friedrich W Fahnert

(57) ABSTRACT

The invention concerns a method and signal conversion device for avoiding undesirable noise in the start up of an amplifying device, as well as to an amplifying device including such a signal conversion device. The signal conversion device (12) comprises a variable gain providing unit ($Q_3$, $Q_4$, $Q_5$, $Q_6$), a voltage to current converter ($Q_1$, $Q_2$, $R_1$, $R_2$), a variable gain control unit (22) controlling the variable gain of the variable gain providing unit, and a bias current control unit (20) for controlling a first biasing current ($I_{B1}$) of the voltage to current converter, for avoiding DC offset originating noise as well as noise originating from components of the signal conversion device.

21 Claims, 3 Drawing Sheets

10

$I_1$

16

$V_I$

12

14

$V_0$

PLOP NOISE AVOIDANCE FOR AN AMPLIFIER

Figure 1:
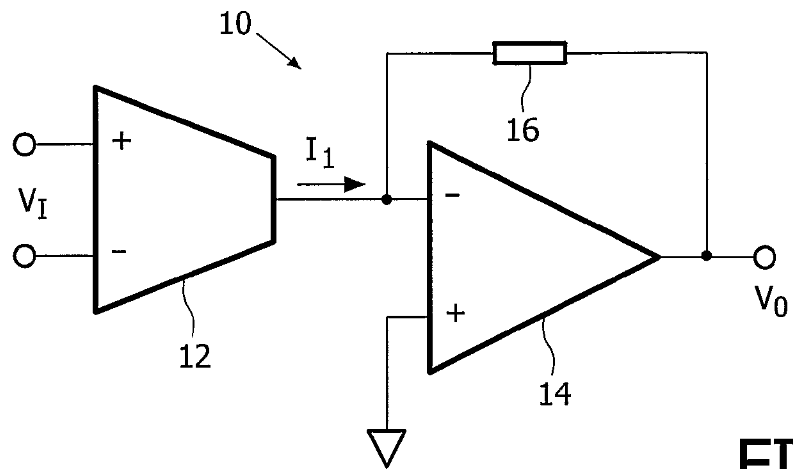

The present invention is generally directed towards the field of amplifier stages, for example class D audio amplifier stages, and more particularly towards a method and signal conversion device for avoiding undesirable noise in the start up of an amplifying device, as well as to such an amplifying device including such a signal conversion device.

In the field of audio power amplifiers there is at start up and possibly at shut down an audible plop noise that emanates from the DC level of the components in the amplifier. This noise appears because the DC level is rapidly applied or removed. This noise is in many cases annoying for a user. A power amplifier does in these circumstances often include a voltage/current converter that is connected to an operational amplifier, which is connected in a negative feed back loop. The plop noise is then occurring because components provided in the voltage/current converter diverge from their nominal values.

One way of overcoming such a plop noise is to connect the voltage/current converter to a variable gain providing unit. A combination of a variable gain providing unit in the form of a variable gain amplifier with a voltage current converter is for instance known through EP 1357 664, the introductory part of which describes an output voltage provided by a variable gain amplifier based on an input voltage provided to a voltage/current converter. The variable gain amplifier and voltage/current converter are however described in relation to the provision of high precision gain control. There is no discussion about plop noise or the reduction of the influence of the cause of that noise.

If such a combination is used for reducing plop noise, the gain of the variable gain providing unit would be gradually and slowly increased from a minimum gain to a maximum gain in order to increase the transconductance of the V/I converter from 0 to 100%. This effectively makes the plop noise inaudible. During the making of this plop noise inaudible an additional problem is however introduced. The problem is that the variable gain providing unit introduces an audible hissing noise in a certain gain interval. The making of the plop noise inaudible has thus introduced another noise, which is often more annoying to a user than the original plop noise.

There is thus a need for making plop noise inaudible while at the same time avoiding the introduction of new noise in an amplifier.

The present invention is therefore directed towards solving the problem of making, in an amplifier, the plop noise inaudible while at the same time avoiding the introduction of new noise.

One object of the present invention is thus to provide a method that makes, in an amplifier, the plop noise inaudible while at the same time avoiding the introduction of new noise.

According to a first aspect of the present invention, this object is achieved by a method of avoiding undesirable noise in the start up of an amplifier, which amplifier comprises a first signal conversion device having a variable gain providing unit and a voltage to current converter controlled by at least one first biasing current and comprising the steps of:

varying the gain of the variable gain providing unit, and varying the first biasing current of the voltage to current converter, for avoiding DC offset originating noise as well as noise originating from components of the signal conversion device.

Another object of the present invention is to provide a signal conversion device, which makes, in an amplifier, the plop noise inaudible while at the same time avoiding the introduction of new noise.

According to a second aspect of the present invention, this object is achieved by a signal conversion device for avoiding undesirable noise in the start up of a power amplifier, and comprising:

a variable gain providing unit, a voltage to current converter, a variable gain control unit controlling the variable gain of the variable gain providing unit, and a bias current control unit for controlling a first biasing current of the voltage to current converter, for avoiding DC offset originating noise as well as noise originating from components of the signal conversion device.

Yet another object of the present invention is to provide an amplifying device, which makes the plop noise inaudible while at the same time avoiding the introduction of new noise.

According to a third aspect of the present invention, this object is achieved by an amplifying device comprising a signal conversion device according to the second aspect.

According to claim 2, the gain and the first biasing current are each varied from a maximum to a minimum value which makes the plop noise inaudible as well as avoids further noise in a simple manner.

According to claim 3, the variations of the gain and first biasing current are correlated and the first biasing current is closer to its minimum value when the variable gain providing unit produces maximal noise. This measure limits the noise provided by the variable gain providing unit, while still allowing simple control of the variable gain and first biasing current.

According to claim 4, the first biasing current is at 10 percent or less of its maximum value when the variable gain providing unit provides maximal noise. This measure even further limits the noise provided by the variable gain providing unit, while still allowing simple control of the variable gain and first biasing current.

According to claim 5, the first biasing current is at its minimum value when the variable gain providing unit provides maximal noise, which provides an even higher output noise limitation.

According to claim 6 and 15, the variable gain providing unit is provided via two differential transistor pairs, where the bases of one transistor in each pair is driven by a variable voltage. The voltage to current converter also comprises a differential transistor pair. This feature provides a simple realization of the signal conversion device.

According to claim 7, the first biasing current is provided through duplicating a second biasing current, which enables the use of the second biasing current to control the voltage gain providing unit.

According to claim 8 and 9, 16 and 17, a fourth differential transistor pair is used for generating the second biasing current, which is a simple and cost-efficient way to provide biasing currents.

According to claim 10, the transistors in the first, second and third transistor pair have different size relationships. This feature allows the use of the same source for providing first biasing current and variable gain control voltage, which greatly simplifies the overall control.

According to claim 11 and 18, the base voltage controlling the second biasing current is used as variable gain control voltage.

According to claims 8 and 12, 16, 19, 20, the fourth differential transistor pair is only used for providing the variable gain control voltage. This enables the addition of other functions that are to influence the gain of the variable gain providing unit but not the first biasing current.

Claims 13 and 21 are directed toward providing one preferred additional function for the variable gain providing unit. This is the function of limiting current output from the signal conversion device based on the temperature of the device, which can be advantageous in certain overload situations.

With the present invention there is provided the possibility to make the plop noise inaudible while at the same time avoiding the introduction of new noise, like thermal noise. The invention can furthermore be provided in a simple and cost-efficient way using analog components. Because of this the invention can advantageously be provided on one chip. The gain control and the biasing current control can either be provided together or independently of each other.

The basic idea of the invention is to vary, in an amplifier, the gain of a variable gain providing unit and the biasing current of a voltage to current converter connected to the variable gain providing unit, so that DC offset originating noise as well as component originating noise is avoided.

The above mentioned and other aspects of the invention will be apparent from and elucidated with reference to the embodiments described hereinafter.

Figure 2:
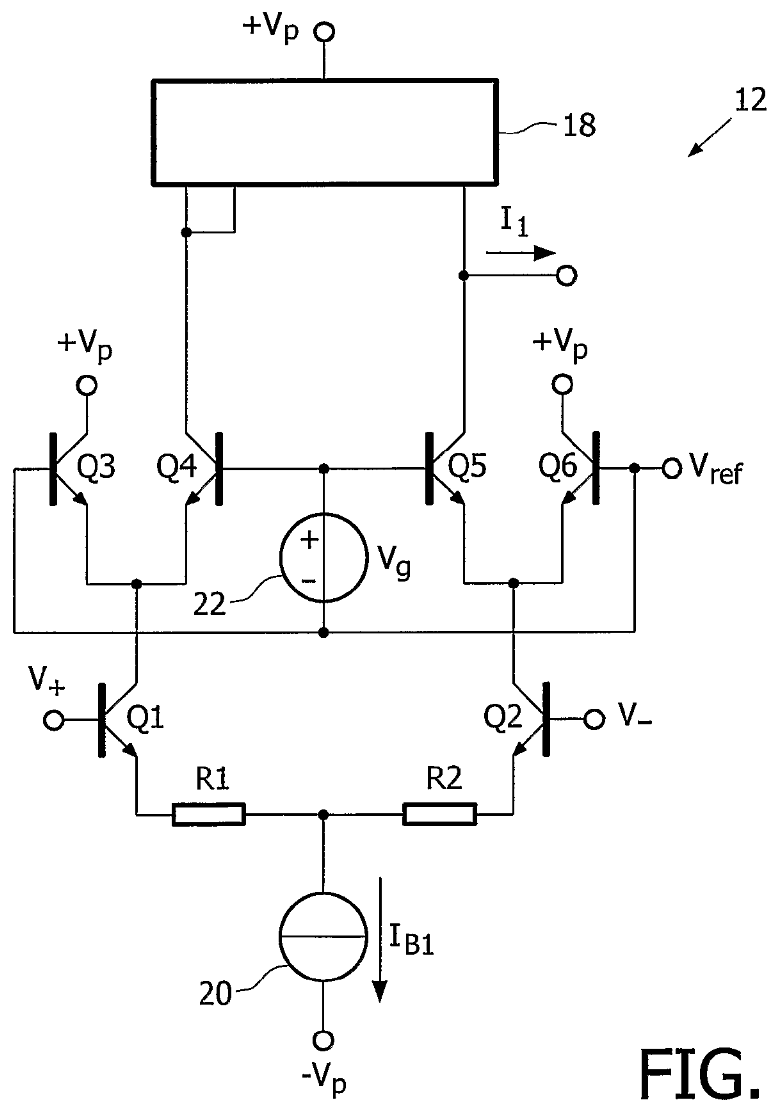
Figure 3:
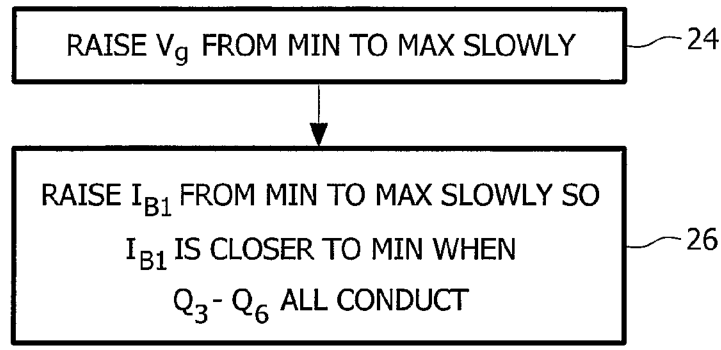
Figure 4:
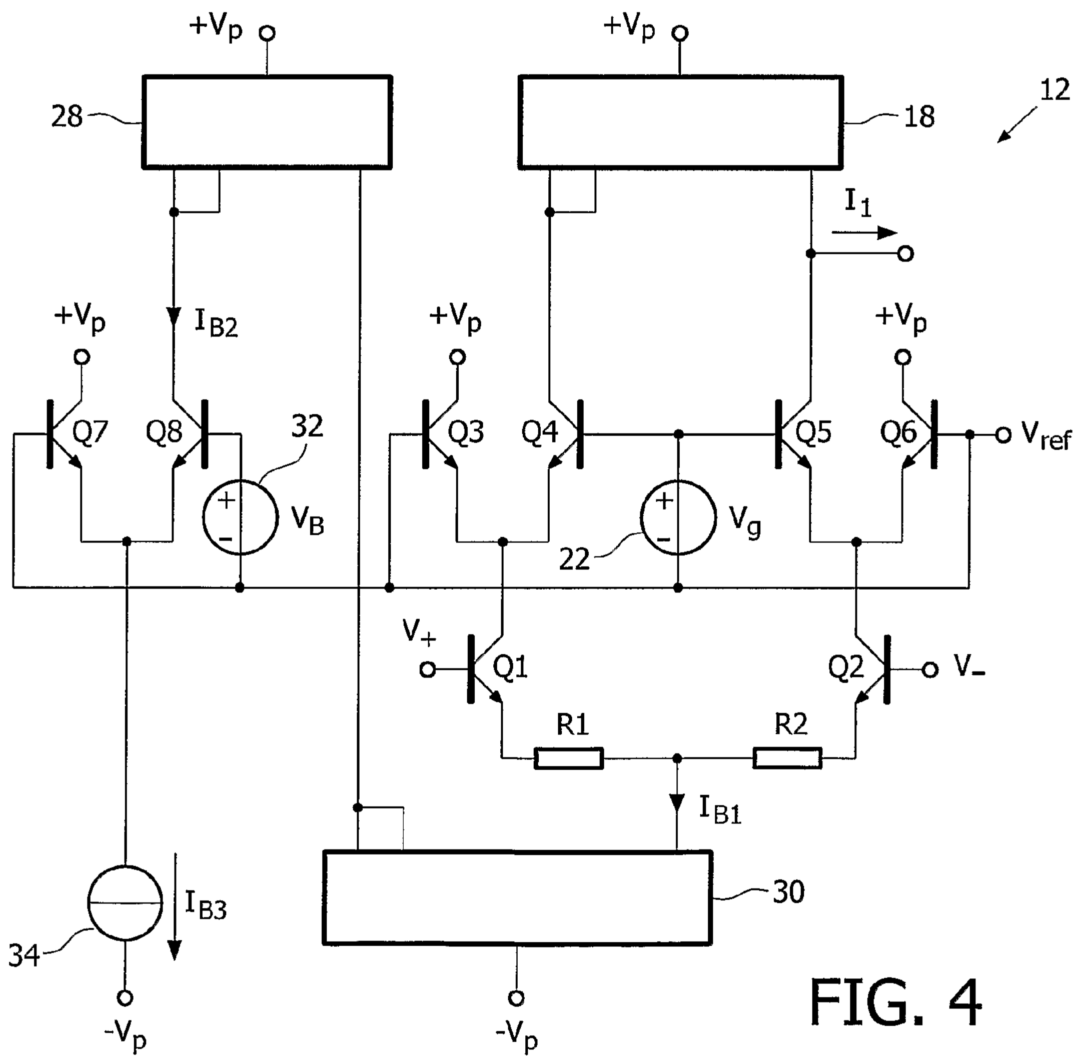
Figure 5:
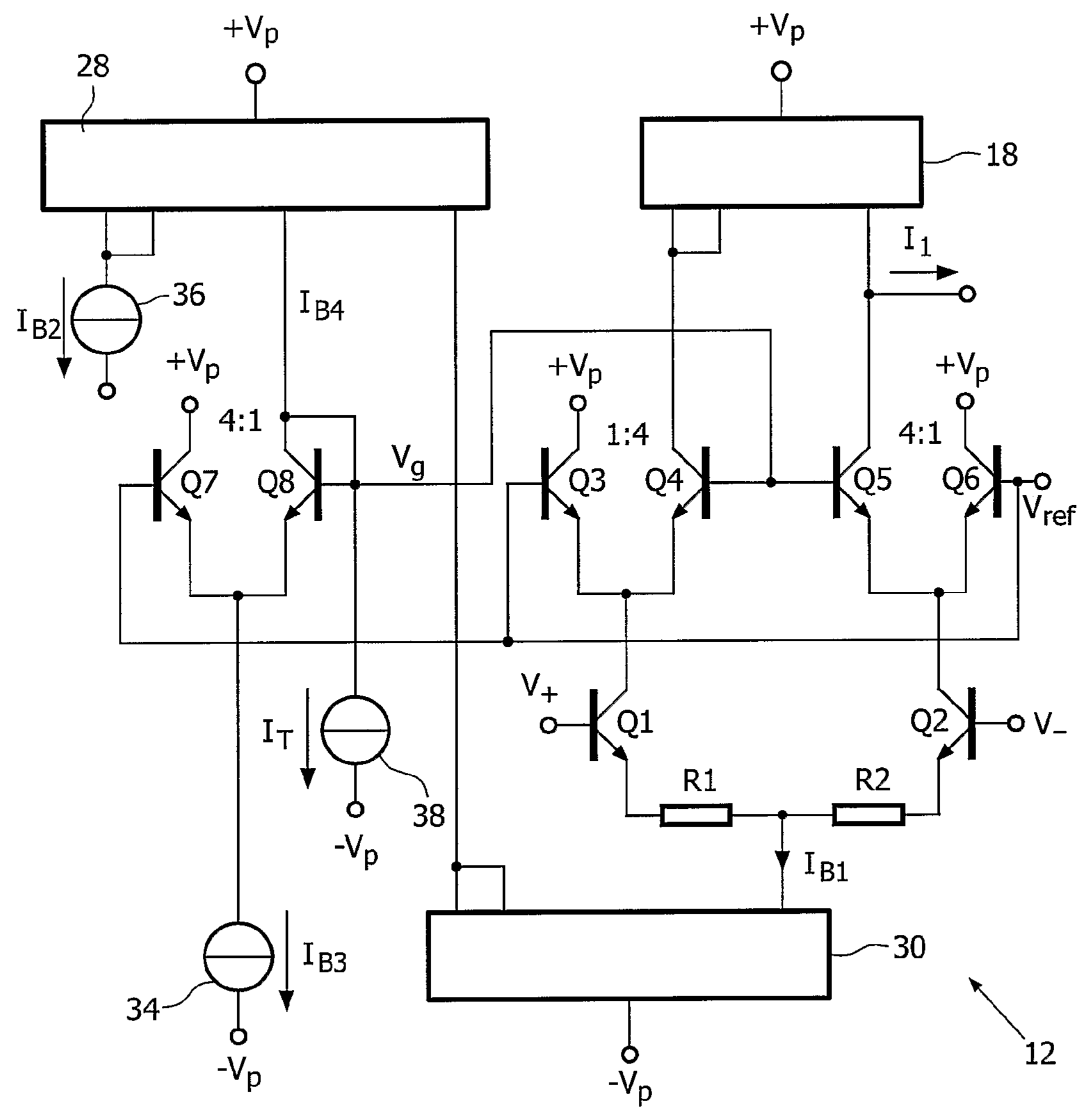

The present invention will be further described in relation to the accompanying drawings, in which:

FIG. 1 shows a circuit diagram of an amplifying device according to the invention, FIG. 2 shows a circuit diagram of a signal conversion device according to a first embodiment of the present invention, FIG. 3 shows a flow chart of one method according to which the device of the first embodiment can be made to work, FIG. 4 shows a circuit diagram of a signal conversion device according to a second embodiment of the present invention, and FIG. 5 shows a circuit diagram of a signal conversion device according to a third embodiment of the present invention.

The present invention is generally directed towards amplifiers and then in particular to audio amplifiers.

FIG. 1 shows an audio amplifier 10 according to the invention. The amplifier comprises a signal conversion device in the form of a voltage to current converter 12 which receives an input voltage $V_I$ which it converts to an intermediate current $I_1$. The voltage to current converter 12 is connected to the negative input of an operational amplifier 14, the positive input of which is connected to ground. The output of the operational amplifier 14 is connected to the negative input via a resistor 16. This creates a virtual ground at the negative input of operational amplifier 14. The operational amplifier is thus connected in a negative feedback loop and receives the intermediate current $I_1$ and produces an output voltage $V_O$ from this current.

When standard audio amplifiers that are designed in this way are used for driving a loudspeaker, a plop noise is emitted when the amplifier is first set into operation. This plop noise is something that is annoying for users of these devices and therefore something that is interesting to avoid.

One object of the present invention is to make this noise inaudible.

FIG. 2 shows a circuit diagram of the signal conversion device 12 according to a first embodiment of the present invention. As can be seen from the bottom of FIG. 2, the signal conversion device 12 has a first current source 20 connected to a negative supply voltage $-V_P$. The current source 20 is further connected to a connection point between a first and a second resistor $R_1$ and $R_2$, which resistors are connected in series and have the same resistance. The other end of the first resistor $R_1$ is connected to the emitter of a first bipolar NPN transistor $Q_1$, the base of which is connected to the positive input potential $V_+$. The other end of the second resistor $R_2$ is connected to the emitter of a second bipolar NPN transistor $Q_2$, the base of which is connected to the negative input potential $V_-$. The bases of the first and second transistor $Q_1$ and $Q_2$ thus together receive the input signal $V_I$. The collector of the first transistor $Q_1$ is connected to a connection point of the interconnected emitters of a third and fourth bipolar NPN transistor $Q_3$ and $Q_4$, while the collector of the second transistor $Q_2$ is connected to a connection point of the interconnected emitters of a fifth and sixth bipolar NPN transistor $Q_5$ and $Q_6$. The bases of the fourth and fifth transistors $Q_4$ and $Q_5$ are connected to one end of a voltage source 22, which is further connected to a reference voltage $V_{ref}$. The bases of the third and sixth transistors $Q_3$ and $Q_6$ are also connected to the reference voltage $V_{ref}$. The collectors of the third and sixth transistors $Q_3$ and $Q_6$ are connected to a positive supply voltage $+V_P$, while the collectors of the fourth and fifth transistors $Q_4$ and $Q_5$ are connected to the positive supply voltage $+V_P$ via a first current mirror 18, which first current mirror 18 copies the current running through the fourth transistor $Q_4$ with a ratio of 1:1 to the current running towards the fifth transistor $Q_5$. The output signal in the form of the intermediate current $I_1$ is provided from the connection point between the current mirror 18 and the collector of the fifth transistor $Q_5$. The third and fourth transistors $Q_3$ and $Q_4$ make up a first transistor pair, the fifth and sixth transistors $Q_5$ and $Q_6$ make up a second transistor pair, while the first and second transistors $Q_1$ and $Q_2$ make up a third transistor pair. The first and second transistor pairs together with the voltage source 22 furthermore provide a variable gain providing unit, which provides a gain between 0 and 1, while the first transistor pair together with the current mirror 18, the first and second resistors $R_1$ and $R_2$ and the first current source 20 make up a linear voltage to current converter. This voltage to current converter has a so-called T-configuration. The circuit in FIG. 2 is generally referred to as a "Gilbert Multiplier".

In normal operation the voltage applied at the bases of the first and second transistors $Q_1$ and $Q_2$ is converted into an intermediate current $I_1$. The first current source 20 here provides a first biasing current $I_{B1}$. The first biasing current $I_{B1}$ is here made up of two parts, where a first part is drawn through the first transistor $Q_1$ and a second part is drawn through the second transistor $Q_2$. If the voltage is zero, i.e. V+ and V− are equal, this first biasing current $I_{B1}$ is normally divided equally in two in the two branches. In a normal voltage to current converter, the variable gain providing unit would not be included and then the output intermediate current $I_1$ would only be dependent on the current running through the first and the second transistor $Q_1$ and $Q_2$. The above mentioned plop noise is then dependent on the deviations from their nominal values of the first and second transistors $Q_1$ and $Q_2$ and the first and second resistors $R_1$ and $R_2$, i.e. they are not exactly as specified, which leads to a dc level of the output current being provided, that gives raise to the plop noise when the output signal is converted back to a voltage and then provided to a loudspeaker. With the introduction of the first and second transistor pairs a variation of the output current is obtained depending on the gain of the variable gain providing unit. The first and second transistor pairs should be symmetrical in relation to each other, i.e. the first transistor pair should have the same properties as the second pair, and in this first embodiment they are all equal providing the same amplification properties.

The transfer of the circuit in FIG. 2 is given by the following equation:

$$I_1 = \frac{V_+ - V_-}{R} \cdot \frac{1}{1 + e^{-\frac{q}{kT}V_g}}$$

where $R=R_1+R_2$, k is the Boltzmann constant, q is the elementary charge of an electron and T is the temperature of the device. This transfer can be realized with less than −80 dB THD (Total Harmonic Distortion).

Assume first that the current $I_{B1}$ is constant. A variable gain control voltage $V_g$, which is PTAT (Proportional to Absolute Temperature) in order to achieve temperature independence and is slowly raised or ramped up from a minimum voltage to a maximum voltage, is applied to the bases of the fourth and fifth transistors $Q_4$ and $Q_5$. The minimum voltage is below the reference voltage $V_{ref}$, here zero, that is applied at the bases of the third and sixth transistors $Q_3$ and $Q_6$. When the voltage $V_g$ is applied the following scenario will take place. First the third and sixth transistors $Q_3$ and $Q_6$ are conducting, since then $V_{ref}$ is higher than $V_g$. In this case the output intermediate current $I_1$ is zero, since then $Q_4$ and $Q_5$ are non-conducting. The output intermediate current $I_1$ then does not have any noise. As the voltage $V_g$ is raised the fourth and fifth transistors $Q_4$ and $Q_5$ are starting to conduct and for a while all four transistors of the first and second transistor pairs are conducting. In this case thermal noise provided by the first and second transistor pairs is evident in the output current, which results in a hissing noise in a driven loudspeaker. The maximum noise level is provided when $V_g$ is zero, i.e. all four transistors conduct equally. After the voltage $V_g$ leaves this region, basically only the fourth and fifth transistors $Q_4$ and $Q_5$ conduct. These transistors then act as simple cascodes and hardly contribute any noise. An output current is furthermore only provided when the fourth and fifth transistors $Q_4$ and $Q_5$ conduct.

The slow raising of the voltage $V_g$, which leads to a gradually increasing output intermediate current $I_1$, makes the plop noise inaudible but adds this hissing noise when all transistors of the first and second transistor pairs are conducting at the same time. In order to reduce this added noise the first current source 20 is controlled for providing a varying current.

One way that the first current source 20 and the voltage source 22 can be driven is outlined in FIG. 3, which shows a flow chart of one way of driving the device in FIG. 2. The variable gain control voltage $V_g$ of the variable gain providing unit is raised from its minimum to its maximum value slowly, step 24, and the first biasing current $I_{B1}$ is raised or ramped up from its minimum to its maximum value slowly in such a way that $I_{B1}$ is closer to its minimum value than its maximum value when all of $Q_3$, $Q_4$, $Q_5$ and $Q_6$ are conducting, step 26, and produce maximum noise.

This control can be made in a number of ways. The point in time that the first biasing current $I_{B1}$ is started to be provided can be set such that the voltage $V_g$ has left the interval where it makes all four transistors in the first and second transistor pairs to conduct. It can also be raised simultaneously with or slightly after the voltage $V_g$ but at a different rate, such that the current is at a fraction of its end value, that is preferably less than 10% or about 5%, when the transistors are in the middle of the noise interval (i.e. $V_g$ is zero). The gain is thus coupled to the control of the first biasing current $I_{B1}$. In this way both the plop noise and the hissing noise are at least limited to inaudible levels when the amplifier is turned on.

A control unit controlling the voltage source 22 and a control unit controlling the current source 20 is then needed for making this happen, which control unit makes sure that the variable gain control voltage $V_g$ and first biasing current $I_{B1}$ are controlled in one of the ways described above.

The above signal conversion device can be provided in a simple and cost-efficient way using analog components. Because of this the invention can advantageously be provided on one chip.

A signal conversion device 12 according to a second embodiment of the present invention is shown in a circuit diagram in FIG. 4, which comprises the same voltage to current converter and variable gain providing unit in the right hand side of the electric circuit diagram. The difference here is that a control unit on the left hand side provides the first biasing current $I_{B1}$. A seventh bipolar NPN transistor $Q_7$ has its collector connected to the positive supply voltage $+V_p$. A second current mirror 28 is connected to the positive supply voltage $+V_p$, where one branch of the second current mirror 28 is connected to the collector of an eighth bipolar NPN transistor $Q_8$ and a second branch of the second current mirror 28 is connected to a third current mirror 30, to which is also connected the connection point between the first and second resistors $R_1$ and $R_2$. The third current mirror 30 is connected to the negative supply voltage $-V_p$. The emitters of the seventh and eighth transistors $Q_7$ and $Q_8$ are connected to each other and to a second current source 34, which in turn is connected to the negative supply voltage $-V_p$. The seventh and eighth transistors $Q_7$ and $Q_8$ here form a fourth differential transistor pair. The base of the seventh transistor $Q_7$ is connect to the reference voltage $V_{ref}$, while the base of the eight transistor $Q_8$ is connected to a voltage source 32 providing a variable voltage $V_B$, which source is at is other end connected to the reference voltage $V_{ref}$. All current mirrors have a 1:1 relationship between the currents provided. Also the voltage source 32 needs to be PTAT and in the same range as voltage source 22. There does however need to be a voltage difference between voltage sources 22 and 32, such that the voltage of source 22 is always higher than the voltage of source 32.

In operation the voltage to current converter and variable gain providing unit functions principally in the same way as in the first embodiment, where the first biasing current $I_{B1}$ is controlled by the differential transistor pair of $Q_7$ and $Q_8$. Here a second biasing current $I_{B2}$ drawn through the eighth transistor $Q_8$ is copied by the current mirrors 28, 30 for providing the first biasing current $I_{B1}$. The second current source 34 provides a third biasing current $I_{B3}$ that is drawn from the fourth transistor pair. In operation the second biasing current source 34 draws the third biasing current $I_{B3}$ from either the seventh $Q_7$ or the eight transistor $Q_8$ or both, where initially the seventh transistor $Q_7$ is conducting and not the eighth $Q_8$. This means that no current runs through the eighth transistor $Q_8$ and consequently no current is copied by the second and third current mirrors 28 and 30 and therefore $I_{B1}$ is then zero. As the voltage $V_B$ is then increased, the eighth transistor $Q_8$ starts to conduct and when $V_B$ is around zero the seventh and eighth transistors $Q_7$ and $Q_8$ each provide half the current of current source 34, while at larger values of $V_B$ the eighth transistor $Q_8$ provides essentially all the current of $I_{B3}$. This means that initially the first biasing current $I_{B1}$ is zero, while it is at half its maximum value when $V_B$ is zero and thereafter reaches its maximum value of $I_{B3}$ when the eighth transistor $Q_8$ provides all of the current. As can thus be seen it is then essential that $V_B$ is smaller than $V_g$, at least when $V_g$ is in the noise interval, for providing less than half the maximum value of the first biasing current $I_{B1}$.

This embodiment enables a simple control mechanism of voltage gain and first biasing current. It would however be advantageous to have only one source controlling both the variable gain and the first biasing current. The second embodiment can thus be varied. One way of doing this is for instance by dividing the voltage $V_g$ with resistors. This however leads to unnecessary energy consumption. Another and preferred way of enabling the same source for control is to vary the size of the transistors of the first, second and fourth transistor pairs.

According to one such variation the seventh transistor $Q_7$ has a size relation of 4:1 to the eighth transistor $Q_8$, i.e. it is 4 times as big. Also the fourth transistor $Q_4$ has a size relation of 4:1 to the third transistor $Q_3$ as does the fifth transistor $Q_5$ to the sixth transistor $Q_6$. When this is done the voltages $V_B$ and $V_g$ can be identical and therefore directly provided by the same voltage source. Since the fourth transistor $Q_4$ is bigger than the third transistor $Q_3$ and the fifth transistor $Q_5$ is bigger than the sixth transistor $Q_6$, these bigger transistors conduct more current than when they are equally sized. Because of the size difference, the critical noise area of the first and second transistor pairs is shifted downwards, such that this area now has its center at:

$$V_g = -\frac{kT}{q} \cdot \ln(4)$$

Because of the opposite size difference of the transistors in the fourth transistor pair, the point where they are providing equal current is shifted upwards in a similar manner. Thus the first biasing current $I_{B1}$, which is equal to the current running through the eighth transistor, is at only a fraction of its maximum current and in this example at 5.9% of its maximum value for the voltage in the expression above, which thus limits the thermal noise in the output intermediate signal $I_1$ considerably.

By having the same type of voltage $V_g$ and $V_B$, the control is much simplified. After a while, the eighth transistor $Q_8$ will provide essentially all the current drawn by the second current source 34, but when this happens the variable gain providing unit has reached its maximum value since long.

The above described variation of the second embodiment allows the use of only voltage source to control both the variable gain control voltage and the first biasing current, which simplifies control considerably. There are further variations that can be made in line with what has been described above. It should be realized that other relationships than 4:1 can be used depending on which relationship between $V_g$ and $I_{B1}$ is desired. It is furthermore possible to have one internal relationship between the transistors of the first and second transistor pairs and another for the fourth transistor pair. It is for instance possible to let the fourth transistor pair have a 1:1 relationship combined with the above described 4:1 relationship or another such relationship, like for instance 8:1 or 16:1. It is also possible to have a 1:4, 1:8 or perhaps 1:16 relationship in the fourth transistor pair and a 1:1 relationship in the first and second transistor pairs. It should thus be realized that countless different variations can be made of these size relationships. It is however important that these variations lead to the first biasing current being at less than half its maximum level when the first and second transistor pairs provide maximum thermal noise.

A third embodiment of the signal conversion device according to the invention is shown in a circuit diagram in FIG. 5. The circuit in FIG. 5 has many of the components of FIG. 4, where the differences will be described here. The sizes of the first, second and fourth transistor pairs have been varied according to the above described variation of the second embodiment. The voltage to current converter and variable gain providing unit are essential provided in the same way as in FIG. 4, but the voltage $V_g$ is here provided by a voltage provided at the base of the eighth transistor $Q_8$. The base of the eighth transistor $Q_8$ is furthermore connected to the collector of the same transistor. In the control unit, the second current mirror 28 has three branches, where a first is connected to a third current source 36, which now provides the second biasing current $I_{B2}$. This second biasing current is copied by the second current mirror 28 and provided as input current $I_{B4}$ to the collector of the eighth transistor $Q_8$, and as input current to the second current mirror 30, which copies it and provides the copy as the first biasing current $I_{B1}$ of the voltage to current converter. The base of the eighth transistor $Q_8$ is furthermore connected to a fourth current source 38, which provides a temperature dependent current $I_T$, which current source 38 is further connected to the negative supply voltage $-V_p$.

In normal operation the third current source 36 provides the second biasing current $I_{B2}$, which is copied into the first biasing current $I_{B1}$ by the current mirrors 28 and 30. The fourth differential transistor pair furthermore constitutes a current to voltage converter, which initially converts the current $I_{B4}$ to the voltage $V_g$ that is supplied to the bases of transistors $Q_4$ and $Q_5$ for controlling the variable gain providing unit. Thus the current source 36 is made to control both the first biasing current $I_{B1}$ and the voltage $V_g$ controlling the variable gain providing unit. The controlling is basically done in the same way as in the device in FIG. 4, but here the voltage $V_g$ is solely depending on the current $I_{B4}$ at low temperatures, which current is a replica of the current $I_{B2}$. The fourth current source 38 provides a temperature dependent current $I_T$, which current is zero at low temperatures and starts to increase with temperature when the temperature exceeds a certain threshold level. When the temperature thus reaches said threshold level this current source starts to draw current, which means that less of the current $I_{B4}$ enters the eighth transistor $Q_8$. Consequently the voltage $V_g$ is lowered and thus the gain of the variable gain providing unit is lowered. This leads to a reduction of power delivered to the loudspeaker and also a reduction of dissipation in the audio amplifier output stage 14 which lowers the temperature. This feature therefore leads to a self regulation of the device so that the output intermediate current $I_1$ is lowered in case too high a current is supplied. After a while normal operation is then in most cases resumed. This feature is advantageous in certain overload situations.

The third embodiment therefore provides an additional use of the signal conversion device. The temperature control of the third embodiment does not influence the first biasing current, which is good since this biasing current is only varied for reducing thermal noise at start up. A simple control of the biasing current and the variable gain control voltage is at the same time still possible by using only one current source. Another advantage of this third embodiment is that the signal conversion device according to the invention can be used for more parts of the operation than at start up, which gives good economy. The whole signal conversion device is preferably provided on one and the same chip and then the current source 38 is dependent on the temperature of this chip.

The invention can be varied in a number of ways. It should be realized that the voltage to current converter is not limited to a T-configuration, but can also be provided in a Π-configuration. The transistors used can also be other types of transistors. The provision of the variable gain control voltage and the first biasing current could be made such that a timer delays the start of the biasing current variation until after the variable gain control voltage has passed the critical interval. It is furthermore possible to vary the rate of increase of both these control parameters in such a way that they are linear. Other ways of providing these than through the use of differential transistor pairs are also possible.

It should be emphasized that the term "comprises/comprising" when used in this specification is taken to specify the presence of stated features, integers, steps or components, but does not preclude the presence or addition of one or more other features, integers, steps, components or groups thereof. It should furthermore be realized that reference signs appearing in the claims should in no way be construed as limiting the scope of the present invention.

The invention claimed is:

1. A method of avoiding undesirable noise in an amplifier comprising a variable gain providing unit coupled to a voltage to current converter, the method comprising:

when starting the amplifier, controlling a gain of the variable gain providing unit to limit plop noise in the voltage to current converter below a predetermined threshold; and controlling a first biasing current of the voltage to current converter to limit hissing noise below the predetermined threshold, wherein a single source automatically controls both the variable gain and the first biasing current.

2. The method of claim 1, further comprising:

raising the variable gain from a minimum value to a maximum value; and raising the first biasing current from a minimum value to a maximum value.

3. The method of claim 2, further comprising:

correlating the variable gain and the first biasing current such that the first biasing current is closer to its minimum value than its maximum value when the variable gain providing unit has a gain that produces maximal noise.

4. The method of claim 3, wherein the first biasing current is at ten percent or less of its maximum value when the variable gain providing unit has the gain that produces maximal noise.

5. The method of claim 4, wherein the first biasing current is at its minimum value when the variable gain providing unit has the gain that produces maximal noise.

6. The method of claim 3, wherein the variable gain providing unit further comprises:

a first differential transistor pair and a second differential transistor pair, wherein a base of one transistor in each differential transistor pair is driven by a variable gain control voltage, and the voltage to current converter further comprises:

a third differential transistor pair biased by said first biasing current, wherein the first biasing current is closer to its minimum value than its maximum value when all transistors of the first and the second differential transistor pairs are conducting.

7. The method of claim 6, further comprising:

duplicating a second biasing current.

8. The method of claim 7, wherein at least a copy of the second biasing current runs through one transistor in a fourth differential transistor pair, wherein a base of said transistor in the fourth differential transistor pair is connected to a base voltage.

9. The method of claim 8, wherein the base voltage is a variable voltage provided by a variable voltage source controlling the second biasing current that is running through said transistor in the fourth differential transistor pair.

10. The method of claim 8, wherein transistors in the first, second and fourth differential transistor pairs have variable sizes.

11. The method of claim 8, wherein the base voltage provides the variable gain control voltage.

12. The method of claim 11, wherein a collector and the base of said transistor in the fourth differential transistor pair are interconnected, and the current running through said transistor is provided through copying the second biasing current provided by an additional current source in order to provide the variable gain control voltage.

13. The method of claim 1, further comprising:

lowering the variable gain of the variable gain providing unit in dependence of the temperature of the signal conversion device in order to protect the signal conversion device.

14. A signal conversion device for avoiding undesirable noise when starting a power amplifier, the signal conversion device comprising:

a variable gain providing unit;

a voltage to current converter coupled to the variable gain providing unit;

a variable gain control unit, while starting the power amplifier, controlling the variable gain of the variable gain providing unit to limit plop noise in the voltage to current converter below a predetermined threshold; and a bias current control unit for controlling a first biasing current of the voltage to current converter to limit hissing noise drops below the predetermined threshold, wherein a single source automatically controls both the variable gain and the first biasing current.

15. The device of claim 14, wherein the variable gain providing unit further comprises:

a first differential transistor pair; and a second differential transistor pair, wherein bases of one transistor in each differential transistor pair are driven by a variable gain control voltage and the voltage to current converter further comprises:

a third differential transistor pair biased by said first biasing current.

16. The device of claim 15, wherein the bias current control unit further comprises:

a fourth differential transistor pair; and at least one current mirror that provides the first biasing current through duplicating a second biasing current, wherein a base of one transistor in the fourth differential transistor pair has a base voltage.

17. The device of claim 16, further comprising:

a variable voltage source that provides the base voltage to control the second biasing current.

18. The device of claim 17, wherein the bias current control unit also includes the variable gain control unit such that the base voltage is used as a variable gain control voltage.

19. The device of claim 16, further comprising:

an additional biasing current source that provides the second biasing current.

20. The device of claim 19, wherein the base voltage is obtained through a connection made between the base and a collector of said transistor in the fourth differential transistor pair.

21. The device of claim 20, further comprising:

a temperature dependent current source connected to the base of said transistor of the fourth differential transistor pair that lowers the variable gain of the variable gain providing unit when a temperature of the signal conversion device is too high.

* * * * *